United States

Schiebelhuth

4,040,719

Aug. 9, 1977

[54] FREQUENCY INDICATOR FOR RECEIVING DEVICES

[76] Inventor: Heinz F. Schiebelhuth, Frankfurt am Main, Germany

[21] Appl. No.: 597,644

[22] Filed: July 21, 1975

[30] Foreign Application Priority Data

July 22, 1974 Germany .............................. 2435088

[51] Int. Cl.² .......................... G02F 1/28; H04B 1/16; H03J 1/04
[52] U.S. Cl. ............................ 350/160 LC; 325/455; 334/86; 340/336
[58] Field of Search ................. 350/160 LC; 340/336, 340/324 R; 58/50 R; 325/455; 324/78 D; 334/86, 87

[56] References Cited

U.S. PATENT DOCUMENTS

| 3,735,387 | 5/1973 | Miller | 324/78 D |
|---|---|---|---|
| 3,803,834 | 4/1974 | Reese | 58/50 R |
| 3,835,424 | 9/1974 | Marick | 334/87 |
| 3,885,218 | 5/1975 | Pfab | 325/455 |
| 3,898,642 | 8/1975 | Dorey et al. | 340/324 R |

OTHER PUBLICATIONS

"Liquid Crystal Display for the Sake of the Prototype for an HiFi-FM Receiver" Radio Menter Electronic, vol. 41, No. 5, p. 196, May 1975.
Sheingold, D. H., "Analog-Digital Conversion Handbook" Analog Devices Inc., June 1972, pp. II-48-50.
"Liquid Crystal/CMOS Offer Minimal-Power Digital Displays" RCA Solid State Databook, Series SSD-2-03A, 1973 edition, pp. 315-318.

*Primary Examiner*—John K. Corbin
*Assistant Examiner*—R. Hille
*Attorney, Agent, or Firm*—Richard A. Wise; Oistein J. Bratlie; Donald E. Mahoney

[57] ABSTRACT

A liquid crystal display panel for indicating operating frequency of a receiver is operated by a circuit providing digital control signals and an alternating current signal.

6 Claims, 4 Drawing Figures

FREQUENCY INDICATOR FOR RECEIVING DEVICES

BACKGROUND OF THE INVENTION

1. Field of the Invention

This invention relates to display panels and, more particularly, to display panels comprising a plurality of liquid crystal elements.

2. Description of the Prior Art

In receiving apparatus, it is advantageous to easily identify the carrier frequency of a transmitter that has just been dialed. A pointer is usually used for this purpose. The pointer is fastened to a string pulley arranged to activate a frequency selecting rotary condensor for tuning the receiver to the transmitter carrier frequency. The position of the pointer relative to a scale on the receiver indicates the frequency to which the receiver is tuned.

In more modern receivers, the scale and pointer has been replaced by a display panel comprising Light Emitting Diodes (LED) arranged to indicate the frequency at which the receiver is tuned. As disclosed in a German publication, *radio mentor*, 10, 1971, page 605, the tuned frequency of the receiver is determined by operating one LED in a display panel having 16 LED's. The position of the operaating LED relative to the other diodes in the display panel determines the turned frequency of the receiver.

In another prior art receiver, an electronic front plate has been proposed in which LED's likewise indicate the tuned frequency of the receiver. As disclosed in the German publication *Elector*, Apr. 19, 1973, page 21, preselected LED's are switched on at the same time that a direct current (D.C.) tuning voltage is coupled to a variable capacitance diode, such as a varactor diode. A disadvantage with the LED indicators described above is that they are point-shaped and therefore not easily discernible.

It would also be conceiveable to indicate the operating frequency of the receiver by means of analog controlled liquid crystal elements. A display panel comprising liquid crystal elements is described in *Applied Optics*, June 1970, Vol. 9, No. 6, page 1323 in an article entitled "Electronically Scanned Analog Liquid Crystal Displays." It is possible that a display panel comprising liquid crystal elements may be controlled by the D.C. tuning voltage applied to a frequency tuning varactor diode. However, is is desirable to operate liquid crystal elements in response to an alternating current(A.C.)voltage in order to provide a relatively long operating lifetime for the liquid crystal elements. Furthermore, an antilogarithmic relationship exists between the turning frequency and the D.C. tuning voltage applied to the varactor diode, so that a non-linear course would result on the display panel. To this must be added that a sharp, definite transition between controlled and uncontrolled regions in a liquid crystal display panel is difficult to attain when the liquid crystal elements operate in response to an analog signal. Thus, in an analog liquid crystal display for receivers, there exists a transition region between light and dark which does not permit exact reading of receiver operating frequency.

SUMMARY OF THE INVENTION

An indicator is provided by a display panel comprising a plurality of liquid crystal elements with first and second electrodes. Digitally coded signals are applied to decoder means operating to provide control signals for the liquid crystal elements. Converting means convert the control signals to an alternating current signal for operating the liquid crystal elements.

These and other features and other advantages of the invention will be understood from a consideration of the following specification taken in conjunction with the accompanying drawings.

DESCRIPTION OF THE PREFERRED EMBODIMENT

Figure 1:
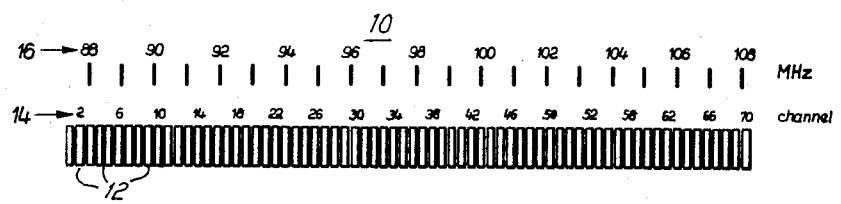
FIG. 1 is a section from a receiver scale.

Referring to FIG. 1, there is shown a plurality of equally spaced liquid crystal elements 12 arranged to form a display panel 10 for indicating operating frequency of a receiver. For example, 70 rectangular-shaped liquid crystal elements 12 are included in the display panel 10. Printed above the elements 12 are numerals indicating selectable channels 14, numbered from 1 to 70 inclusively, and above the chanels 14 are printed numerals 16 indicating frequency of the receiver in MHz. The crystal elements 12 are digitally controlled and operate in response to an alternating current (A.C.) signal to be either translucent or transparent to indicate the turned frequency of the receiver or one of the selectable channels 14 in which the receiver is tuned. An A.C. voltage is required across each element comprising the display panel 10 to assure a long operating life for the liquid crystal elements 12. The liquid crystal display panel 10 can be arranged to operate in either transmissive or reflective modes. The transmissive mode type display panel requires a light source behind the liquid crystal elements 12. The light will either be transmitted or not depending upon the voltage across the liquid crystal elements 12. In the reflective-mode type display panels, ambient light can be scattered by the liquid crystal material, or reflected from a mirrored surface placed behind the liquid crystal elements 12. If displayed correctly, excellent contrast by ON and OFF liquid crystal elements 12 can be obtained when reflecting or scattering only ambient light. The operating frequency of the receiver may be indicated by the spatial position of a single actuated element or the operation of a plurality of liquid crystal elements to provide a moving ribbon or bar-shaped indication of receiver operating frequency. A prior art analog display technique for liquid crystal display panels in which the size, shape and location of a two-dimensional display pattern can be changed with low voltage, low power control is disclosed in an article entitled "Electronically Scanned Analog Liquid Crystal Displays" published in *Applied Optics*, Vol. 9, No. 6, June 1970.

Figure 2:
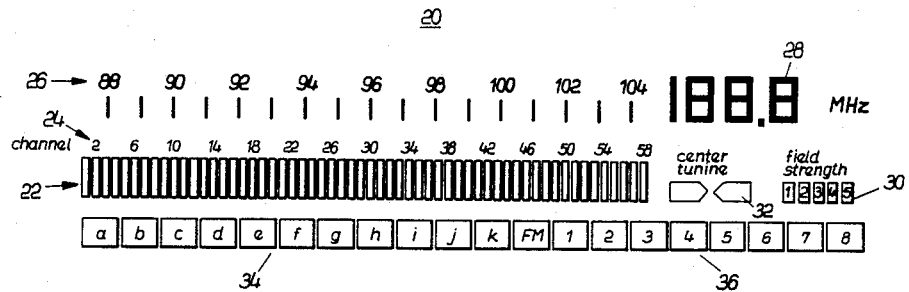
FIG. 2 is a section from a receiver scale with additional indicating capabilities.

Referring to FIG. 2, there is shown another embodiment of a receiver display panel 20 including a plurality of equally spaced liquid crystal elements 22. In contrast with the display panel 10 shown in FIG. 1, the display panel 20 has, for example, 58 liquid crystal elements 22 are numerals indicating selectable channels 24 or frequency bands numbered from one to 58 inclusively, and above the channels 24 are printed numerals 26 indicating frequency of the receiver in MHz. In addition, the display panel 20 has a digital frequency indicator 28 employing liquid crystal elements for displaying the carrier frequency of a transmitter that has just been dialed. The display panel 20 also has a digital field strength indicator 30. Furthermore, the display panel 20 has a center turning means 32 and several signal reverting panels 34 and 36. The signal reverting panel 34 may comprise push-button selectors lettered $a$ through $k$, inclusively, and the signal reverting panel 36 may comprise push-button selectors numbered 1 1 through 8, inclusively, to signal back functions or various devices for turning the receiver to a desirable transmitter carrier frequency. The center tuning means 32 is arranged, as known in the art, to indicate whether the receiver is sharply tuned to the frequency of the transmitter. Operation of the liquid crystal elements comprising the digital frequency indicator 28 may be accomplished by means well known in the art.

Figure 3:
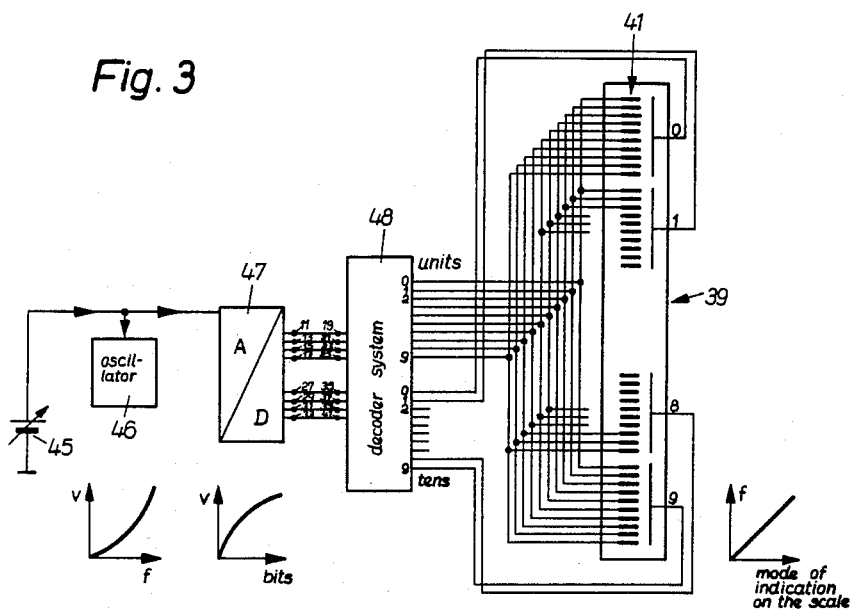
FIG. 3 is a schematic of a receiver circuit arranged according to the invention to digitally control the operation of a liquid crystal display panel.

Referring to FIG. 3, there is shown a schematic of a receiver circuit arranged, according to the invention, to digitally control a linear display panel 39 having a plurality of liquid crystal elements 41 operating in response to an A.C.signal. For example, the receiver display panel 39 includes 100 liquid crystal elements and printed above each of the elements are numerals indicating receiver operating frequency, as described above in reference to FIGS. 1 and 2. The receiver circuit arrangement of FIG. 3 has a variable voltage source 45 including a turning potentiometer, not shown, for providing an analog or continuously variable turning voltage. The tuning potentiometer and the analog tuning voltage from the source 45 is set by a person operating the receiver. A voltage tuneable oscillator 46 for turning the operating frequency of the receiver to the carrier frequency of a transmitter is connected to the voltage source 45. The voltage tuneable oscillator 46 includes a diode, not shown, such as a varactor diode electrically characterized as having a voltage dependent capacitance. The varactor diode responds to the analog tuning voltage to tune the operating frequency of the oscillator 46 and the receiver, in a manner well known in the art. The analog tuning voltage from the source 45 is also coupled to an analog-to-digital converter 47 arranged to digitalize the analog tuning voltage and generate logic signals preferably in Binary Code Decimal (BCD) code. The BCD code pertains to a number-representation system in which each decimal digit is represented by a unique arrangement of binary digits, usually four. In the 8-4-2-1 binary-coded-decimal notation, a number comprising a tens digit and a units digit, for example the number 23, may be represented as 0010 0011, where the binary number 0 refers to a logic signal at a relatively low voltage level, and the binary number 1 refers to a logic signal at a relatively high voltage level. Thus, if a BCD code is chosen, four lines per decade of units digits are connected from the converter 47 output terminals 11, 13, 15 and 17 to decoder system 48 input terminals 19, 21, 23 and 25 respectively, and four lines per decade of tens digits are connected from converter 7 output terminals 27, 29, 31 and 33 to decoder system 48 input terminals 35, 37 39 and 41, respectively. The decoder system 48 is arranged to respond to a combination of converter 47 output signals representing the digital value of the digitalized turning voltage and accordingly provide an output signal for controlling a predetermined liquid crystal element out of the one-hundred liquid crystal elements comprising the display panel 39. To avoid 100 output lines, from the decoder system 48, all first electrodes of the liquid crystal elements operating to represent a number having the same units digit can be switched in parallel, as shown in FIG. 3. All second electrodes of the liquid crystal elements operating to represent a number the same tens digit are connected together as a matrix which can be controlled separately, as described below.

A linear analog-to-digital converter 47, may not be useable with the linear display panel 39 to indicate receiver frequency if an anti-logarithmic relationship between the analog tuning voltage and the frequency of the oscillator 46, as shown in FIG. 3, in the graph of analog tuning voltage, $V$, vs. oscillator output frequency, $f$. The antilogarithmic relationship is minimized, according to the invention by using a logarithmic analog-to-digital converter 47 for converting the logarithm of the tuning voltage to a digital number. In addition, the converter 47 is temperature independent to avoid indication errors produced by changes in temperature. An example of the analog-to-digital converter 47 operating in a dual-slope process to produce a logarithmic output is disclosed in "Analog-to-Digital Converter Produces Logarithmic Output," published in *Electronics*, July 5, 1973.

For direct digital indication of the oscillator 46 frequency, as shown in FIG. 2, the decoder system 48 output terminals for the units and tens digits can, for example, be connected to a prior art numeric arrangement of liquid crystal cells comprising seven elements.

Figure 4:
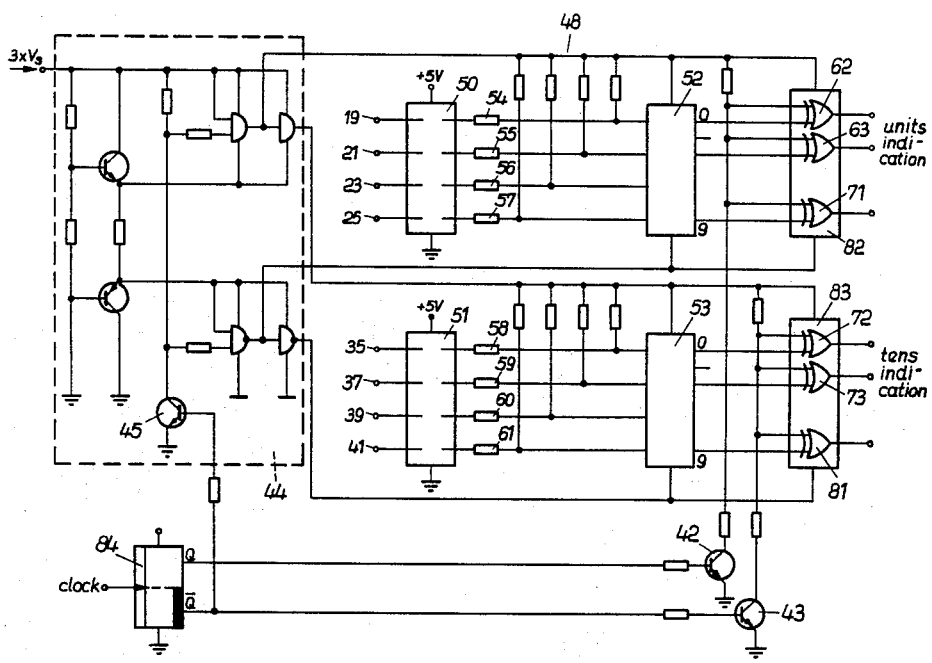
FIG. 4 is a more detailed schematic of a decoder system shown in FIG. 3.

Referring to FIG. 4, there is shown a schematic of the decoder system 48 arranged to control the liquid crystal elements 41 forming the display panel 39. The right half of the decoder system 48 includes units and tens driver stages 50 and 51, respectively. The units driver stage 50 responds to output from the converter 47 to provide signals suitable for operating a BCD to decimal decoder for a units digit 52. The tens driver stage 51 responds to output signals from the converter 47 to provide signals suitable for operating a BCD to decimal decoder 53 for a tens digit. The driver stages 50 and 51 are arranged to respond to the converter 47 output signals to provide signals suitable for operating logic circuits which can, for example, be designed by use of MOS technology. An example of the driver stages 50 and 51 is a Hex Buffer/Driver logic circuit with open collector high voltage outputs such as the AN-7407 logic circuit manufactured by Signetics Corporation, California. The units driver stage has four output terminals connected to four input terminals of the units BCD to decimal decoder 52 via resistors 54, 55, 56, and 57. The tens driver stage 51 has four output terminals connected to four input terminals of the tens BCD to decimal decoder 53 via resistors 58, 59, 60 and 61. The BCD to decimal decoders 52 and 53 are arranged to decode the BCD coded input signals and provide an output signal to a selected one of 10 output terminals associated with the units BCD to decimal decoder 52 and an output signal to a selected one of 10 output terminals associated with the tens BCD to decimal decoder 53. The BCD decimal decoder output signals are uniform DC control signals suitable for controlling the operation of a selected liquid crystal element. An example of the BCD to decimal decoders 52 and 53 is a COS/MOS BCD to decimal decoder, DC-4028, manufactured by RCA, New Jersey.

The output terminals of the units and tens BCD to decimal decoders 52, 53 are connected to first input terminals of exclusive OR gates 62–81. The OR gates β–71 are referred to as the units OR gates 82 and the OR gates 72–81 are referred to as the tens OR gates 83. A second input terminal of each of the units and tens OR gates 82, 83 is connected to a flip-flop circuit 84 through transistors 42 and 43, respectively. Each of the units OR gates 82 has an output terminal connected to a first electrode of the liquid crystal elements 41 comprising the scale 39. An output terminal of the tens OR gates 83 is connected to a matrix of second or back electrodes of the liquid crystal elements 41.

A clock signal from a source, not shown, is coupled to the flip-flop circuit 84 so that the output D.C. signals from the BCD to decimal decoders 52, 53 are converted into alternating voltages at a rate substantially equal to one-half the frequency of the clock signal. It will be apparent to one skilled in the art that the first and second electrodes of the liquid crystal elements 41 are controlled in push-pull to provide an alternating voltage substantially without D.C. components to each operating liquid crystal element 41.

Circuit portion 44 is arranged, as known in the art, to provide suitable control signals to the units and tens exclusive OR gates 82, 83 and to avoid a multiplex operation of the decoder system 48. The circuit portion 44 and the matrix arrangement of the back electrodes of the liquid crystal elements 41 provide a predetermined liquid crystal element in accordance with a 3 × voltage (3 × $V_r$) principal to avoid crystal element cross-talk as disclosed in "Liquid Crystal Displays" published in *Journal of Vacuum Science and Technology*, Vol. A10, No 5, September, 1973. the circuit portion 44 is coupled to the flip-fop circuit 84 via transistor 45 to provide the control signal at one-half the frequency of the clock signal.

A preferred embodiment of the invention has been shown and described. Various other embodiments and modifications thereof be apparent to those skilled in the art. For example, while the preferred embodiment is the form of a liquid crystal display panel for indicating operating frequency of a receiver, the disclosed invention concept can be used in the construction of display panels for other apparatus.

A preferred embodiment of the invention discloses means for controlling liquid crystal elements through a D.C. tuning voltage applied to a varactor diode for tuning receiver frequency. The D.C. tuning voltage is applied to a logarithmic analog-to-digital converter arranged to provide digitally coded output signals. The converter output signals are coupled to a decoder system arranged to provide uniform D.C. output signals for controlling a predetermined liquid crystal element. An exclusive OR gate responds to the decoder system output signals and signals from a flip-flop circuit to provide an alternating current output signal suitable for operating the predetermined liquid crystal element.

A liquid crystal display panel arranged according to the invention is able to clearly and distinctly indicate the carrier frequency of a liquid crystal display panel without the use of additional mechanical parts. Digital control of the liquid crystal display panel provides sharp delineation between bright and dark regions of the display panel and a minimization of the effect of hysterisis on the accuracy of frequency indication provided by the panel. Resolution and precision of readability of the liquid crystal display panel is dependent only on the width of the indicator liquid crystal elements and on the operation of the decoder system. The uniform control signals provided by the ecoder system operate selected liquid crystal elements with uniform brightness.

What is claimed as new and desired to be secured by Letters Patent of the United States is:

1. A display panel having a plurality of liquid crystal elements arranged to indicate operating frequency of signal receiving means being tuned by a DC analog tuning signal having a continuously variable magnitude comprising:
    logarithmic analog-to-digital converter means for converting said analog tuning signal to digitally coded signals;
    decoder means responsive to said digitally coded signals for providing digital control signals; and
    means for converting said digital control signals to an alternating current signal for operating said liquid crystal elements.

2. A display panel according to claim 1, wherein said analog-to-digital converter means operates according to a duel-slope process.

3. A display panel according to claim 1, wherein said digitally coded signals is in BCD code.

4. A display panel according to claim 1, wherein said means for converting said digital control signals to said alternating current control signal is an exclusive OR gate.

5. A display panel for indicating operating frequency of a radio receiver, comprising:
    a plurality of liquid crystal elements;
    decoder means;
    logarithmic analog-to-digital converter means for providing digitally coded signals to said decoder means, said decoder means responding to said coded signals to provide control signals for said liquid crystal elements;
    voltage tunable oscillator means responsive to a DC analog tuning voltage for varying said operating frequency of said radio receiver, said analog tuning voltage being coupled to said means for providing digitally coded signals to said decoder means, and
    means for converting said control signals to an alternating current signal and applying said alternating current signals to said liquid crystal elements to display said radio receiver operating frequency.

6. A liquid crystal display apparatus for indicating operating frequency of a radio receiver, said apparatus being responsive to a DC analog tuning signal determining said radio receiver operating frequency, comprising:
    logarithmic analog-to-digital converter means for converting said analog tuning signals to digitally coded signals;
    decoder means responsive to said digitally coded signals for providing digital control signals; and
    means for converting said digital control signals to an alternating current signal for operating said liquid crystal display apparatus to indicate said radio receiver operating frequency.

* * * * *

UNITED STATES PATENT OFFICE
CERTIFICATE OF CORRECTION

PATENT NO. : 4,040,719
DATED : August 9, 1977

Page 1 of 2

INVENTOR(S) : Heinz F. Schiebelhuth

It is certified that error appears in the above-identified patent and that said Letters Patent are hereby corrected as shown below:

The patent should be amended to indicate that the assignee is "Braun Aktiengesellschaft, Kronberg, Germany" as recorded in the U. S. Patent and Trademark Office on November 10, 1975.

In the references cited under publications change "Sake" to --Scale-- and "Menter" to --Mentor--.

Column 1, line 28, change "turned" to --tuned--.

Column 2, line 35, change "turned" to --tuned--.

Column 2, line 67, after "22" insert --.--.

Column 2, line 68, before "are" insert --Printed above the elements 22--.

Column 3, line 9, change "turning" to --tuning--.

Column 3, line 13, after "1" delete --1--.

Column 3, line 15, change "turning" to --tuning--.

Column 3, line 32, change "turning" to --tuning--.

Column 3, line 34, change "turning" to --tuning--.

Column 3, lines 36-37, change "turning" to --tuning--.

Column 3, line 67, change "turning" to --tuning--.

Column 4, line 8, after "number" insert --having--.

Column 4, line 13, after "relationship" insert --exists--.

Column 4, line 38, after "output" insert --signals--.

UNITED STATES PATENT AND TRADEMARK OFFICE
CERTIFICATE OF CORRECTION

PATENT NO. : 4,040,719
DATED : August 9, 1977
INVENTOR(S) : Heinz F. Schiebelhuth It is certified that error appears in the above-identified patent and that said Letters Patent are hereby corrected as shown below:

Column 4, line 51, after "stage" insert --50--.

Column 5, line 4, change "$\beta$" to --62--.

Column 5, line 29, after "provide" insert --control of--.

Column 5, line 33, change "A10" to --10--.

Column 5, line 40, after "thereof" insert -- will --.

Column 6, line 6, change "ecoder" to --decoder--.

Signed and Sealed this

*Seventh* Day of *February 1978*

[SEAL]

*Attest:*

RUTH C. MASON
*Attesting Officer*

LUTRELLE F. PARKER
*Acting Commissioner of Patents and Trademarks*